(12) United States Patent
Schindler

(10) Patent No.: US 6,177,631 B1
(45) Date of Patent: Jan. 23, 2001

(54) MODULE CARRIER

(75) Inventor: Walter A. Schindler, Zürich (CH)

(73) Assignee: ELMA Electronics AG, Wetzikon (CH)

( * ) Notice: Under 35 U.S.C. 154(b), the term of this patent shall be extended for 0 days.

(21) Appl. No.: 09/120,702

(22) Filed: Jul. 22, 1998

(30) Foreign Application Priority Data

Aug. 22, 1997 (DE) .............................................. 297 15 114

(51) Int. Cl.⁷ ...................................................... H01J 5/00
(52) U.S. Cl. .......................... 174/50; 220/3.8; 312/265.6; 248/316.3; 361/813
(58) Field of Search .................................... 174/50, 17 R, 174/58, 63; 361/800, 813; 312/265.6, 293.3; 220/3.8, 4.02, 3.92, 3.94; 70/158, 160; 248/316.3, 316.2

(56) References Cited

U.S. PATENT DOCUMENTS

| | | | |
|---|---|---|---|
| 5,086,194 | * 2/1992 | Bruinsma | 174/48 |
| 5,342,209 | 8/1994 | Carney . | |
| 5,354,951 | * 10/1994 | Lange, Sr. et al. | 174/35 R |
| 5,594,208 | * 1/1997 | Cancellieri et al. | 174/58 |

FOREIGN PATENT DOCUMENTS

| | | | |
|---|---|---|---|
| 1247437 | 2/1968 | (DE) . | |
| 7224767 U | 7/1972 | (DE) . | |
| 7629619 U | 9/1976 | (DE) . | |
| 3204767A1 | 11/1983 | (DE) . | |
| 29505894 U1 | 8/1995 | (DE) . | |
| 29502404 U1 | 3/1996 | (DE) . | |
| 29618269 U1 | 1/1997 | (DE) . | |
| 29618628 U1 | 1/1997 | (DE) . | |
| 29605311 U1 | 5/1997 | (DE) . | |
| 29707528 U1 | 8/1997 | (DE) . | |
| 29707756 U1 | 8/1997 | (DE) . | |
| 0727853A1 | 8/1996 | (EP) . | |
| 2702314 | 9/1994 | (FR) . | |
| 2140280 | 11/1984 | (GB) . | |
| 2211364 | * 6/1989 | (GB) | 174/58 |
| 2212668 | * 7/1989 | (GB) | 174/50 |

* cited by examiner

Primary Examiner—Dean A. Reichard
Assistant Examiner—Dhiru R Patel
(74) Attorney, Agent, or Firm—Townsend and Townsend and Crew LLP

(57) ABSTRACT

The figures show module carriers with one straight and one angled sheet metal cover (1, 2) which form an angle connection for a housing. Hooks (3) are bent out from the straight sheet metal lamina (1) on the inner side in order therein to receive a limb (4) of the angled sheet metal lamina (2). Elastic contact springs are formed on the hooks in order to produce a predetermined contact force on the inserted limb. The thickness of the sheet metal lamina and the dimensions of the contact springs and the hooks are matched to one another in such a manner that the hooks can be accommodated within a distance 1<16 mm from an edge (5) of the straight sheet metal lamina (1).

10 Claims, 2 Drawing Sheets

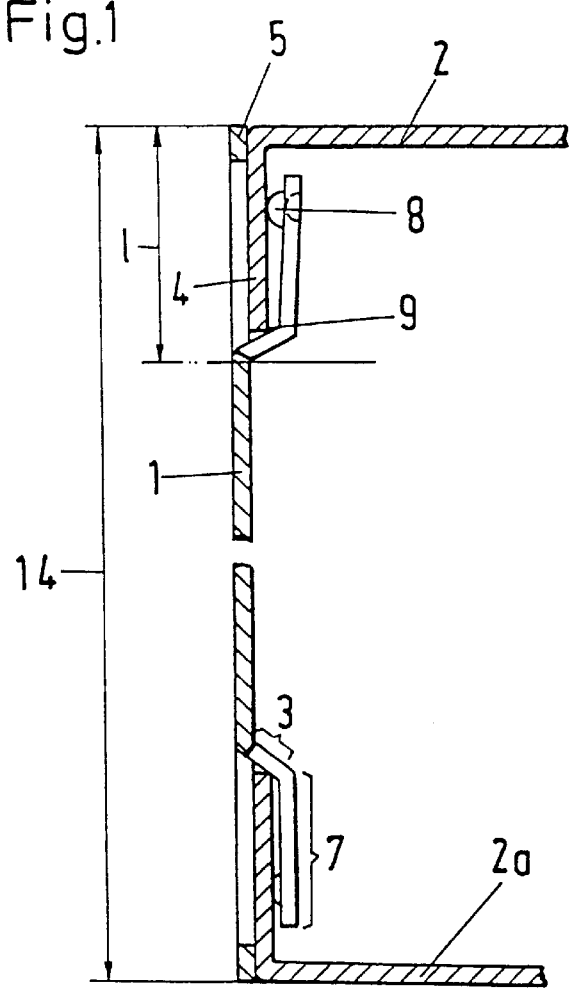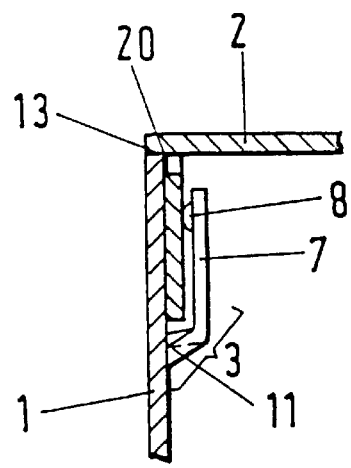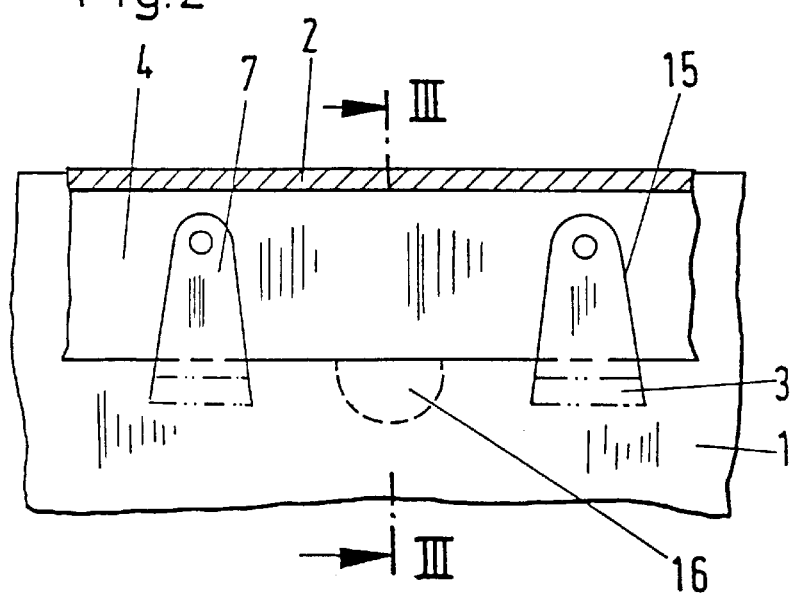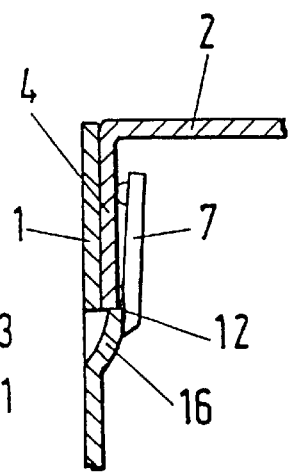

MODULE CARRIER

BACKGROUND OF THE INVENTION

The invention relates to a module carrier with a straight and an angled sheet metal cover which form an angle connection for a housing dimensioned in accordance with the standards of the International Electronic Commission ("IEC"), i.e. IEC standards 297 and 917, with hooks being bent out from the straight sheet metal lamina in order therein to receive a limb of the angled sheet metal lamina.

Published European patent application EP-A-O 727 853 shows module carriers with housings assembled from straight and angled sheet metal lamina. In the overlapping region of the sheet metal lamina unlatchings are made which leave insertable tongues standing, and on the opposite piece eyes into which the tongues can be inserted are bent outwards transverse to the tongues in the same pattern. A disadvantage of this arrangement is that a similar pattern for the tongues and the receiving eyes must be provided in the partition plane between the two sheet metal lamina and that this pattern in the two sheet metal lamina must also lie in the correct position relative to the limitations of the latter housing. This represents a restriction with respect to the flexibility of manufacture.

SUMMARY OF THE INVENTION

It is an object of the present invention to provide a releasable connection which eliminates these disadvantages in the framework of the ranges allowed for the housing structure by IEC standards 297 and 917. This object is satisfied in that the hooks are formed out on the inner side of the housing at a distance 1<16 mm from an edge of the straight sheet metal lamina and in that an elastic contact spring is formed at the hook which produces a predetermined contact force on the inserted limb with a knob.

An arrangement of this kind has the advantage that only one tool is needed for the production of an angle for the bent sheet metal lamina. Since apart from the thickness of the sheet metal lamina of the angled limb all other dimensions which determine the scatter in the contact forces are given by the measurements in the tool which determines the position of the knobs in the straight sheet metal lamina, the predetermined contact forces can be achieved quite precisely. In addition, an overstressing of the contact springs, which rapidly leads to a plastic deformation, particularly in aluminum, is prevented.

The bent out hook part can be provided with a seam to make this part even stiffer relative to the adjoining contact spring. It turns out that the angled limb can lie directly on the hook part since it produces a sufficiently small bending torque with its lever arm, which corresponds to the thickness of the sheet metal -Lamina, when lying on the hook part so that the contact spring which is formed is only slightly influenced. In the event that really unusually large forces are provided in the insertion direction, the final position of the angled limb can be caught up by separate abutments prior to reaching the hook part.

A further possibility of manufacturing a yielding contact spring consists in contracting or tapering it or otherwise weakening it in a direction from the hook part to the knob. For this, wall thicknesses of $0.5 \text{ mm} \leq d \leq 2 \text{ mm}$ for the sheet metal lamina out of which the hooks and contact springs are bent out have proved advantageous. The sheet metal lamina can be of aluminum or steel, with it being possible to define a working range below the threshold of plastic deformation of the contact springs due to the restriction of space conditions for the hooks and contact springs by IEC standards 297 and 917 if their deformation distance S corresponds at least to a value $0.05 \text{ mm} \leq S$ on insertion of the limb and the contact force P corresponds to a value $P \geq 3$ Newton ("N") in a sheet aluminum lamina and $P \geq 5$ N in a sheet steel lamina. Thus, the proposed solution permits the generation of reasonable contact forces without producing plastic deformations and a reduction of the contact force worthy of mention on repeated insertions.

BRIEF DESCRIPTION OF THE DRAWINGS

The invention will be explained with reference to the following drawings which illustrate exemplary embodiments.

FIG. 1 schematically shows a section through a housing side part of a straight sheet metal cover into which an upper part and a lower part of an angled sheet metal cover are inserted;

FIG. 2 schematically shows an interior view onto a housing side part with contact springs and a separate abutment for an angled sheet metal lamina;

FIG. 3 is a section through the illustration of FIG. 2;

FIG. 5 is a variant of FIG. 1 with a depth abutment bent out in the angled sheet metal lamina.

DESCRIPTION OF THE PREFERRED EMBODIMENTS

Figures 4A, 4B:
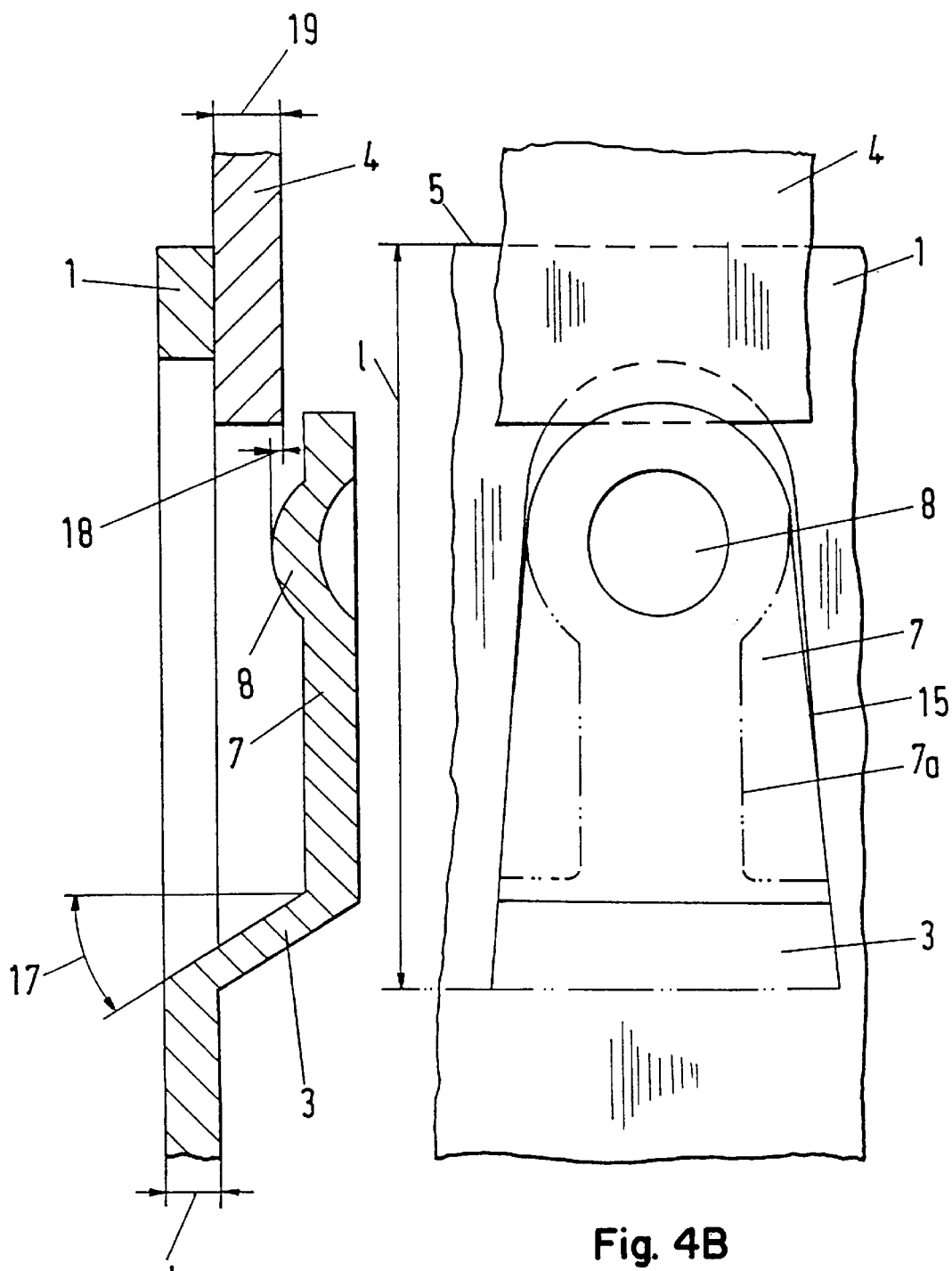
FIG. 4A is a greatly enlarged, side elevational view, in section, of a contact spring.
FIG. 4B is an inside, greatly enlarged elevational view of the contact spring shown in FIG. 4A.

The figures show module carriers with one straight and one angled sheet metal cover 1, 2 which form an angle connection for a housing that is dimensioned in accordance with IEC standards 297 and 917. Hooks 3 are bent out from a straight sheet metal lamina 1 on the inner side thereof in order to receive a limb 4 of the angled sheet metal lamina 2 therein. Elastic contact springs are formed at the hook for generating a predetermined contact force on the inserted limb. The thickness of the sheet metal lamina and the dimensions of the contact springs and the hooks are matched to one another in such a manner that the hooks can be accommodated within a distance 1<16 mm from an edge 5 of the straight sheet metal lamina 1.

FIG. 1 shows an angled sheet metal base 2a and an angled sheet metal cover 2 inserted with their angled limbs 4 on the inside of a straight side sheet metal lamina 1 into bent out hooks 3 the ends of which form elastic contact springs 7. The limbs 4 lie with their ends in contact with a base 9 of the hooks 3 in each case. The ends of hooks 3 forming elastic contact springs 7 have a lens-shaped knob 8. When the limb 4 is pushed in, the knobs are pushed back at the lens-shaped surface which prestresses the associated contact spring to generate a predetermined contact force. The insertion depth of the limbs 4 is dimensioned in such a manner that the angled sheet metal lamina 2, 2a terminate at the height 14 of the straight sheet metal lamina 1. Since the roots of the hooks bent out in the sheet metal lamina 1 are spaced from the edge 5 of the side sheet metal lamina within a distance of 1<16 mm and at the same time sufficient contact forces are produced which are repeatable on insertion, a connection is formed on the inside of the housing which cannot be disturbed mechanically from the outside, while no protrusions or points of attack project outwardly beyond the side sheet metal lamina. Smooth outer surfaces of housings and their edges of this kind enormously facilitate the handling.

FIGS. 2 and 3 show inwardly punched balcony-like webs 16 in a side wall 1 so that limbs 4 of the angled sheet metal lamina 2 lie on an abutment 12 in order to relieve the correspondingly weaker hooks 3 with respect to forces in the direction of the limbs 4 in thin side sheet metal lamina 1. FIG. 5 shows an arrangement similar to FIG. 3. At the angled sheet metal lamina 2, individual shoulders 20 are bent out in the corner which lie on abutments 13 which are let into the edge of the straight sheet metal lamina 1 as recesses. The hooks 3 are provided with a seam 11 for reinforcement in order to form a stable basis for the continuation as a contact spring 7 with its knob 8.

FIG. 4 shows enlarged details of the embodiment of FIG. 1. A hook 3 is bent out at a distance 1<16 mm and at an angle 17 on the inside of the straight sheet metal cover 1. The hook continues parallel to the straight sheet metal lamina 1 as a contact spring 7 which is bulged outwardly to form a knob 8 in its upper region. The hook 3, the contact spring 7 and the knob 8 can first be separated as a rupture web with a single stroke in a tool and can then be plastically deformed into its final shape at the end of the stroke. This has the advantage that all essential dimensions for the contact force, i.e. the contour and position of the knob 8 relative to the inner wall of the straight sheet metal cover 1, can be produced at a connected part and, with a given tool setting, with a high precision of repetition. The tolerance areas for the wall thickness 19 of the limb 4 and for the position of the highest point of the knob 8 are chosen in such a manner that an overlap 18, which corresponds to the deformation distance S of the contact spring at the knob, arises which amounts to at least 0.05 mm. At the same time the contact force corresponds on the average to a value $3\ N \leq P \leq 15\ N$ for sheet aluminum and to a value $5\ N \leq P \leq 30\ N$ for sheet steel. The outward bulge of knob 8 should therefore be greater than the overlap 18 required for a predetermined contact force in order to have a sufficient margin when inserting the limb 4. For a predetermined wall thickness d of the straight sheet metal cover 1, which can lie between 0.5 and 2 mm, the contact spring must be designed so that it remains elastic and no plastic deformation takes place during insertion of the limbs and so that the contact force does not become too great. For this reason the contact force must not be set too high in thick sheet metal lamina with a greater resistance torque of the contact springs.

A further possibility for the reduction of the contact force consists in contracting or tapering the contact spring. This can be done continually with a contraction 15 similar to a trapezoid or in the form of sections 7a with a general reduction in cross-section.

What is claimed is:

1. Module carrier having at least one straight sheet metal lamina and at least one angled sheet metal cover forming an angle connection for a housing comprising hooks bent outwardly from the at least one straight sheet metal lamina in order therein to receive a limb of the angled sheet metal cover, the hooks being formed out at a distance less than 16 mm from an edge of the at least one straight sheet metal lamina and on an inner side of the housing; and an elastic contact spring formed on each of said hooks and producing a predetermined contact force on the received limb with a knob.

2. Module carrier in accordance with claim 1, wherein the limb of the angled sheet metal cover is in contact with a base of the hooks.

3. Module in accordance with claim 2 wherein a seam is provided at the hooks for stiffening.

4. Module carrier in accordance with claim 1 including an abutment bent out at the angled sheet metal cover or at the at least one straight sheet metal lamina for limiting an insertion movement of the limb at a positive distance to a base of the hooks.

5. Module carrier in accordance with claim 1 wherein the contact spring tapers from each of said hooks to the knob.

6. Module carrier in accordance with claim 1 wherein the at least one straight sheet metal lamina from which each of said hooks and said contact spring are bent out has a wall thickness d in a range of $0.5\ mm \leq d \leq 2\ mm$.

7. Module carrier in accordance with claim 6 wherein a deformation distance S during an insertion of the limb of the contact spring lies in a range of $0.05\ mm \leq S \leq 0.3\ mm$.

8. Module carrier in accordance with claim 7 wherein a contact force P has a value in Newtons ("N") of $3\ N \leq P \leq 15\ N$ when the contact spring is made of a sheet aluminum lamina.

9. Module carrier in accordance with claim 7 wherein a contact force P has a value in Newtons ("N") of $5\ N \leq P \leq 30\ N$ when the contact spring is made of a sheet steel lamina.

10. A module carrier having at least one straight sheet metal lamina and at least one angled sheet metal cover comprising a plurality of hooks formed in the at least one straight sheet metal lamina at a location spaced from an edge thereof and extending away from the at least one straight sheet metal lamina for receiving a portion of the at least one angled sheet metal cover between the at least one straight sheet metal lamina and the hooks, the hook being disposed on an inner side of a housing; the hooks forming an elastic contact spring and having a knob proximate a free end of the knob for producing a predetermined contact force that is applied by the knob to the portion of the at least one angled sheet metal cover.

* * * * *